(12) United States Patent
Nishijima et al.

(10) Patent No.: US 6,982,479 B2
(45) Date of Patent: Jan. 3, 2006

(54) SEMICONDUCTOR PACKAGE WITH LEADFRAME INDUCTORS

(75) Inventors: Masaaki Nishijima, Osaka (JP); Tsuyoshi Tanaka, Neyagawa (JP); Daisuke Ueda, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/669,219

(22) Filed: Sep. 24, 2003

(65) Prior Publication Data

US 2004/0061244 A1    Apr. 1, 2004

(30) Foreign Application Priority Data

Sep. 27, 2002  (JP) .............................. 2002-283165

(51) Int. Cl.
  *H01L 23/02*   (2006.01)
(52) U.S. Cl. ...................... 257/678; 257/688; 257/690; 257/691
(58) Field of Classification Search ................ 257/531, 257/621, 666–784
See application file for complete search history.

(56) References Cited

U.S. PATENT DOCUMENTS

| | | | | |
|---|---|---|---|---|
| 3,909,726 A | * | 9/1975 | Dobrovolny et al. | 455/150.1 |
| 4,967,258 A | * | 10/1990 | Fithian et al. | 257/533 |
| 5,905,301 A | | 5/1999 | Ichikawa et al. | |
| 5,994,763 A | * | 11/1999 | Ohmuro | 257/621 |
| 6,140,702 A | * | 10/2000 | Efland et al. | 257/762 |
| 6,621,140 B1 | * | 9/2003 | Gibson et al. | 257/531 |

FOREIGN PATENT DOCUMENTS

JP         9-213826         8/1997

\* cited by examiner

*Primary Examiner*—Hoai Pham
*Assistant Examiner*—Nathan W. Ha
(74) *Attorney, Agent, or Firm*—Hamre, Schumann, Mueller & Larson, P.C.

(57) ABSTRACT

A semiconductor device in which an inductance element formed in a resin package has stable characteristics, impedance matching is achieved easily, and the stability of high-frequency characteristics is improved, more particularly a semiconductor chip sealed within mold resin having a conductor lead extending from an inside of the mold resin to an outside. A portion of the conductor lead inside the mold resin forms an inductance element, at least a part of which is narrower than the external portion of the conductor outside the mold resin.

7 Claims, 7 Drawing Sheets

SEMICONDUCTOR PACKAGE WITH LEADFRAME INDUCTORS

BACKGROUND OF THE INVENTION

1. Field of the Invention

The present invention relates to an improvement in a mounting package for semiconductor devices used in microwave, X or Ku bands.

2. Description of Related Art

In semiconductor mounting packages for mounting high-frequency devices used in microwave, X and Ku bands, there is a demand for miniaturization, cost-reduction and improvement in performance. For example, a four-pin resin package structure as shown in FIGS. 7A and 7B is known as a package for mounting a HEMT (High Electron Mobility Transistor) device for a low-noise amplifier used in a 12 GHz band receiver system (see JP 9(1997)-213826 A, for example).

FIG. 7A is a plan view of a semiconductor device, and FIG. 7B is a sectional view thereof. A premold resin 1 is formed with a source lead 2, a gate lead 3 and a drain lead 4 embedded as one piece. The source lead 2 has a die pad portion 2a and an internal terminal portion 2b that are located inside a recessed portion 7 of the premold resin 1, and an external terminal portion 2c that is located outside the premold resin 1. An HEMT chip 5 is joined to the die pad portion 2a with an electrically conductive adhesive 10. The gate lead 3 and the drain lead 4 extend in a direction perpendicular to the source lead 2, and their internal ends are adjacent to the HEMT chip 5. The source lead 2, the gate lead 3 and the drain lead 4 are molded together with the premold resin 1 in the form of lead frame. After molding, they are separated from the frame (not shown).

The source lead 2 is connected electrically to a source (not shown) of the HEMT chip 5 by bonding wires 6a. A gate (not shown) of the HEMT chip 5 is connected electrically to the gate lead 3 by a bonding wire 6b, and a drain (not shown) thereof is electrically connected to the drain lead 4 by a bonding wire 6c. As shown in FIG. 7B, a cap 9 is attached to an upper end surface of a side wall of the premold resin 1 with an adhesive 8, thus sealing the recessed portion 7.

FIGS. 8A and 8B show a structure of where the HEMT chip 5 and the bonding wires 6a to 6c are connected in the above-described semiconductor device. FIG. 8A is a plan view, and FIG. 8B is a sectional view. The bonding wires 6a to 6c respectively are connected with a source electrode wiring 11, a gate electrode wiring 12 and a drain electrode wiring 13 that are formed on an upper surface of the HEMT chip 5.

FIGS. 9A and 9B respectively show a circuit diagram and a Smith chart of the semiconductor device obtained by mounting the HEMT device on the four-pin resin package in the above-described conventional example in FIG. 9A, numeral 11a denotes a source, numeral 12a denotes a gate, and numeral 13a denotes a drain. The Smith chart in FIG. 9B shows complex impedance (R+jxX). The horizontal line indicates pure resistance (R; inside the circle corresponds to R>0). The top half indicates an inductive reactance component (X>0), while the bottom half indicates a capacitive reactance component (X<0). The left end corresponds to 0 Ω (short circuit), the right end corresponds to ∞Ω (open circuit), and the center corresponds to 50 Ω.

A source inductor 14 shown in FIG. 9A corresponds to an inductance component of the bonding wire 6a as well as a portion of the source lead 2 from the connection position with the bonding wire 6a to an outer end of the external terminal portion 2c in the structure of FIGS. 7A and 7B. As described above, an inductance element is constituted using the bonding wires 6a in the conventional example. In this manner, Gopt (optimum gain matched impedance) and Γopt (minimum noise matched impedance) are adjusted. More specifically, as shown in FIG. 9B, Gopt (optimum gain matched impedance) and Γopt (minimum noise matched impedance) are brought closer to each other, and then matched to the vicinity of 50 Ω.

As described above, in the four-pin resin package in the conventional example, the bonding wires 6a are used as the source inductor 14. Therefore, a variation in the length of the bonding wires 6a at the time of mounting brings about variation in Gopt (optimum gain matched impedance) and Γopt (minimum noise matched impedance) of the HEMT device in microwave, X and Ku bands including the 12 GHz band, as illustrated in FIG. 9B. As a result, high-frequency characteristics, in particular characteristics of gain and noise, vary considerably, thus deteriorating performance stability, causing a problem that a decrease in yield leads to a cost increase.

SUMMARY OF THE INVENTION

It is an object of the present invention to provide a semiconductor device in which an inductance element formed in a resin package has stable characteristics, impedance matching is achieved easily and the stability of high-frequency characteristics can be improved.

A semiconductor device of the present invention includes a semiconductor chip, a mold resin sealing the semiconductor chip, and a plurality of conductor leads extending from an inside of the mold resin to an outside thereof. A portion of the conductor lead arranged inside the mold resin forms an internal terminal portion, and a portion thereof arranged outside the mold resin forms an external terminal portion. An electrode of the semiconductor chip and the internal terminal portion of the conductor lead are connected. The internal terminal portion of at least one of the conductor leads forms an inductance element portion, at least a part of which is narrower than the external terminal portion.

DESCRIPTION OF THE PREFERRED EMBODIMENTS

In accordance with a semiconductor device of the present invention, at least one of plural conductor leads arranged inside a resin package forms a narrow inductance element portion, so that a stable inductance component can be obtained. Thus, impedance matching is achieved easily, and the stability of high-frequency characteristics can be improved.

Preferably, the inductance element portion has a meandering planar shape.

Preferably, the conductor lead having the inductance element portion has an overlapping portion overlapping a lower surface of the semiconductor chip and is connected to the semiconductor chip in the overlapping portion. Further preferably, in the overlapping portion of the electrode of the semiconductor chip and the conductor lead, the connection is made via an electrical conductor in a via hole formed in the semiconductor chip. The overlapping portion of the conductor lead can form a die pad portion on which the semiconductor chip is mounted.

The conductor lead having the inductance element portion can be connected to a source of a field-effect transistor or an emitter of a bipolar transistor formed in the semiconductor chip. Alternatively, the conductor lead having the inductance element portion may be connected to a gate or a drain of a field-effect transistor or a base or a collector of a bipolar transistor formed in the semiconductor chip.

At least one of the conductor leads may be configured so as to function as a choke inductor or a matching element.

The following is a detailed description of semiconductor devices in embodiments of the present invention, with reference to the accompanying drawings.

First Embodiment

Figure 1A:
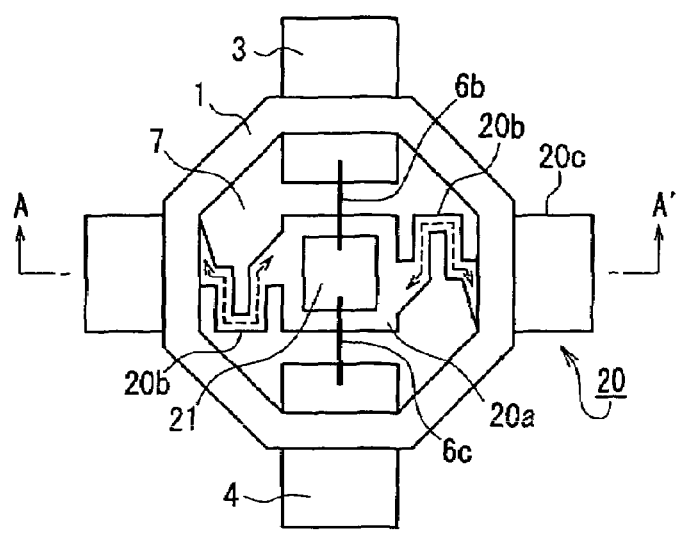
FIG. 1A is a plan view showing a semiconductor device whose cap has been removed in accordance with a first embodiment of the present invention.
Figure 1B:
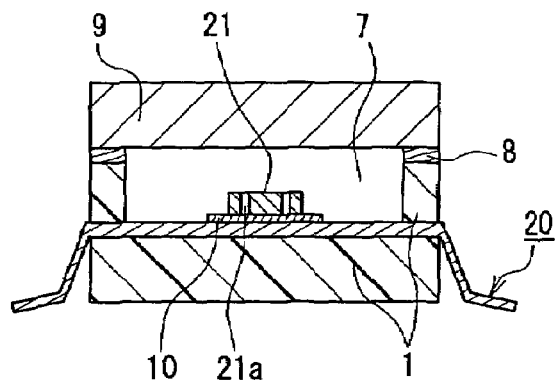
FIG. 1B is a sectional view showing this semiconductor device.
Figure 2:
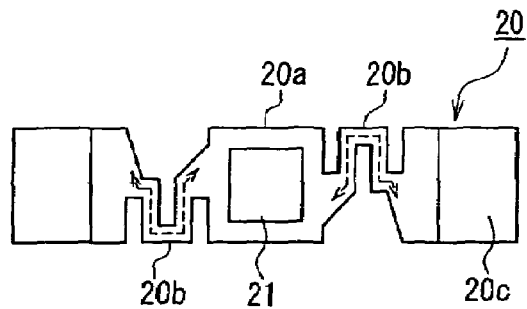
FIG. 2 is a plan view showing a source lead used in the semiconductor device.

FIG. 1A is a plan view showing a semiconductor device having a four-pin resin package structure in a first embodiment. FIG. 1B is a sectional view taken along a line A–A' of FIG. 1A. FIG. 2 is a schematic view showing a planar shape of a source lead incorporated in this semiconductor device.

A premold resin 1 is formed with a source lead 20, a gate lead 3 and a drain lead 4 embedded as one piece. The source lead 20 has a die pad portion 20a and internal terminal portions 20b that are located inside a recessed portion 7 of the premold resin 1, and external terminal portions 20c that are located outside the premold resin 1. An HEMT chip 21 is joined to the die pad portion 20a with an electrically conductive adhesive 10. The gate lead 3 and the drain lead 4 extend in a direction perpendicular to the source lead 20, and their internal ends are arranged adjacent to the HEMT chip 21. The source lead 20, the gate lead 3 and the drain lead 4 are molded together with the premold resin 1 in the form of a lead frame. After molding, they are separated from the frame (not shown).

As shown in FIG. 1A, the internal terminal portions 20b of the source lead 20 form source meander lines, which are meandering conductor lines, between an internal wall of the premold resin 1 and the die pad portion 20a. FIG. 2 shows an overall shape of the source lead 20 in which these source meander lines are formed. The meander lines formed in the internal terminal portions 20b are narrower than the external terminal portions 20c and the die pad portion 20a and arranged so as to wind between the external terminal portions 20c and the die pad portion 20a. The meander lines formed as above serve as inductance elements.

As shown in FIG. 1B, the source lead 20 is connected electrically to a source (not shown) of the HEMT chip 21 via conductors in via holes 21a formed in a thickness direction of the HEMT chip 21. Thus, in the present embodiment, the HEMT chip 21 and the source lead 20 are connected without bonding wires. A gate (not shown) of the HEMT chip 21 is connected electrically to the gate lead 3 by a bonding wire 6b, and a drain (not shown) thereof is connected electrically to the drain lead 4 by a bonding wire 6c. Further, a cap 9 is attached to an upper end surface of a side wall of the premold resin 1 with an adhesive 8, thus sealing the recessed portion 7.

Figure 3A:
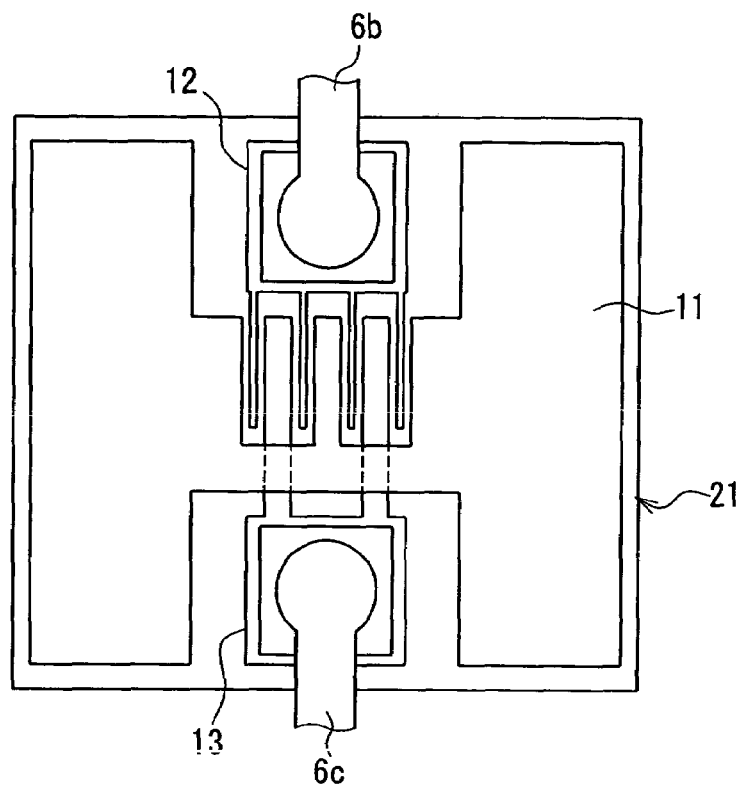
FIG. 3A is a plan view showing a structure of where a semiconductor chip and a source lead are connected in the semiconductor device.
Figure 3B:
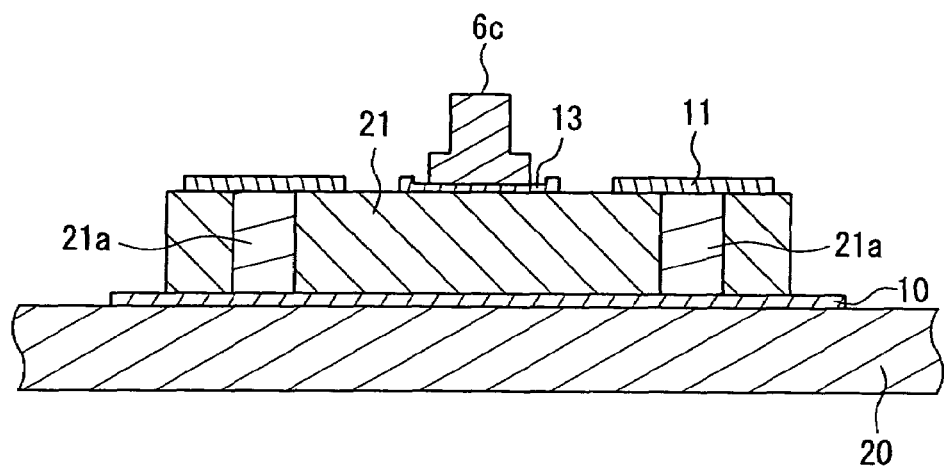
FIG. 3B is a sectional view thereof.

FIGS. 3A and 3B show a structure of where the HEMT chip 21 is connected with the source lead 20 and the bonding wires 6b and 6c in the above-described semiconductor device. FIG. 3A is a plan view, and FIG. 3B is a sectional view. The source lead 20 is connected with a source electrode wiring 11 that is formed on an upper surface of the HEMT chip 21 via the conductors in the via holes 21a. On the other hand, the bonding wires 6b and 6c respectively are connected with a gate electrode wiring 12 and a drain electrode wiring 13.

Figure 4A:
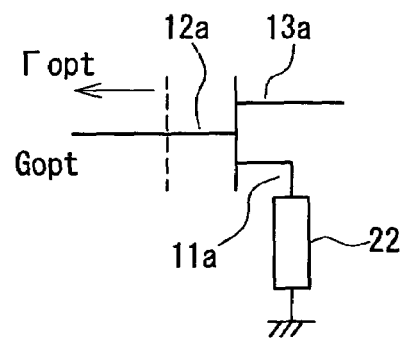
FIG. 4A is a circuit diagram of the semiconductor device in accordance with the first embodiment of the present invention.
Figure 4B:
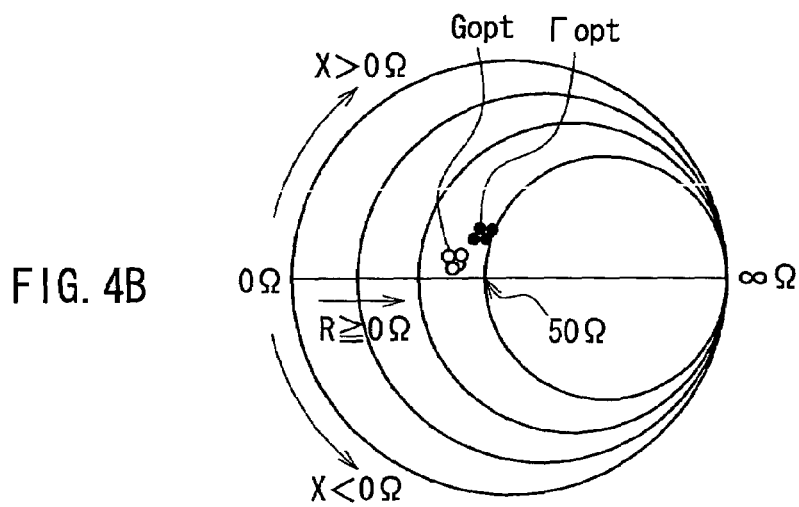
FIG. 4B is a Smith chart thereof.

FIGS. 4A and 4B respectively show a circuit diagram and a Smith chart of the above-described semiconductor device obtained by mounting the HEMT device on the four-pin resin package. In FIG. 4A, numeral 11a denotes a source, numeral 12a denotes a gate, and numeral 13a denotes a drain. A source inductor 22 corresponds to an inductance component of a distributed parameter line that corresponds to a total of the via hole 21a and a portion of the source lead 20 from the connection position with the via hole 21a to an external end of the external terminal portion 20c in the structure of FIGS. 1A and 1B.

In the present embodiment, the source meander lines formed in the internal terminal portions 20b serve as principal inductance components. The lengths of the internal terminal portions 20b are more stable than that of the bonding wires forming the source inductor in the conventional example. Thus, it is possible to avoid the variation in length caused at the time of mounting in the conventional example. As a result, as shown in FIG. 4B, the variation in Gopt and Γopt of the HEMT device is suppressed, so that the variation in gain and noise characteristics is suppressed. This increases yield and achieves cost reduction.

Also, Gopt and Γopt are brought closer to each other, and then matched to the vicinity of 50 Ω, making it possible to achieve both high gain and low noise characteristics.

The source lead 20 does not need to have the die pad portion 20a. For example, internal ends of the internal terminal portions 20b may have portions overlapping the HEMT chip 21, where the internal terminal portions 20b can be connected to the via holes 21a.

Furthermore, the internal terminal portion 20b does not need to form the meander line. In other words, by forming the internal terminal portion 20b to be narrower than the external terminal portion 20c, it also is possible to provide an effective inductance component. Such an example will be described in a second embodiment.

Second Embodiment

Figure 5:
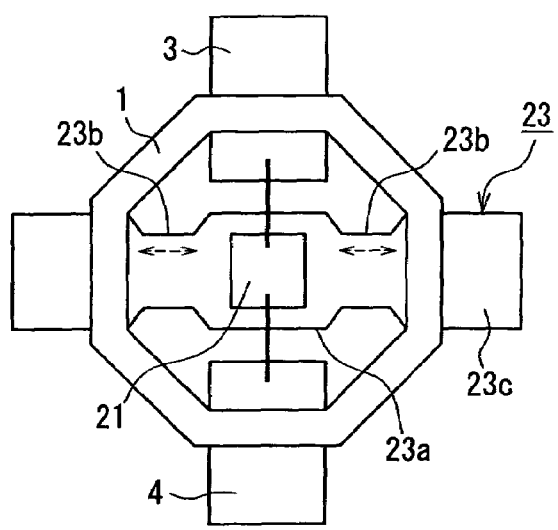
FIG. 5 is a plan view showing a semiconductor device whose cap has been removed in accordance with a second embodiment of the present invention.

FIG. 5 is a plan view showing a semiconductor device in accordance with the second embodiment. Although the internal terminal portions 20b to be connected to the die pad 20a in the source lead 20 are provided as the source meander lines as shown in FIG. 1A in the first embodiment, the internal terminal portions are not meandering but straight in the present embodiment.

As shown in FIG. 5, a source lead 23 has internal terminal portions 23b that are arranged between a die pad 23a and a side wall of a premold resin 1 and are narrower than external terminal portions 23c. Because of such a narrow width, the inductance components of conductor leads increase, thereby achieving an effect similar to that of the source meander lines 20b.

Third Embodiment

Figure 6A:
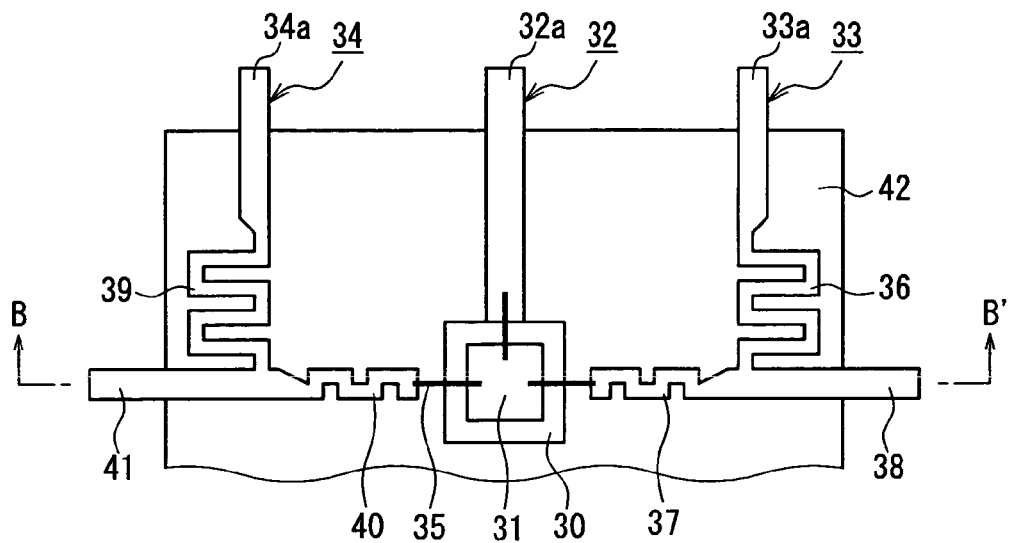
FIG. 6A is a plan view showing a semiconductor device in accordance with a third embodiment of the present invention.
Figure 6B:
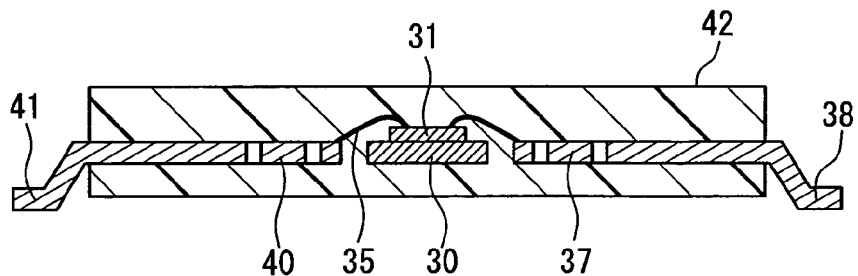
FIG. 6B is a sectional view showing this semiconductor device.
Figure 6C:
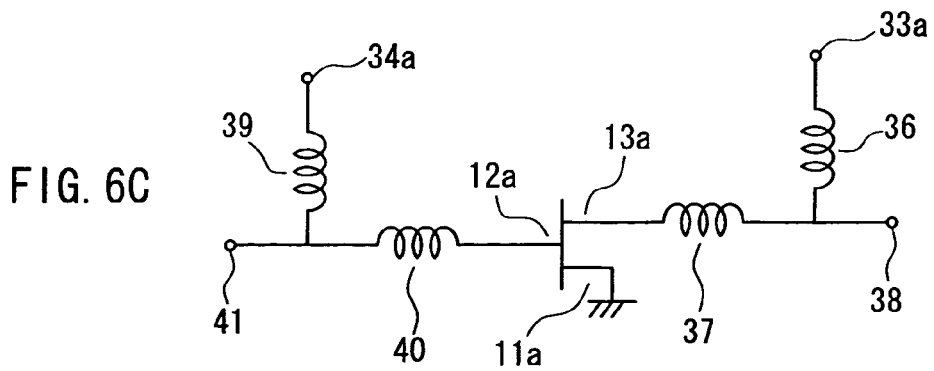
FIG. 6C is a circuit diagram of this semiconductor device.
Figure 7A:
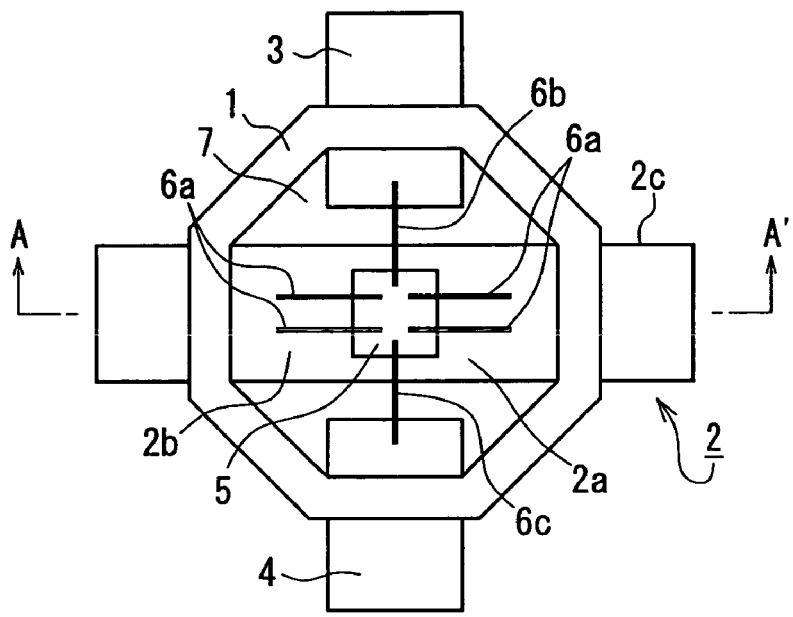
FIG. 7A is a plan view showing a semiconductor device whose cap has been removed in a conventional example.
Figure 7B:
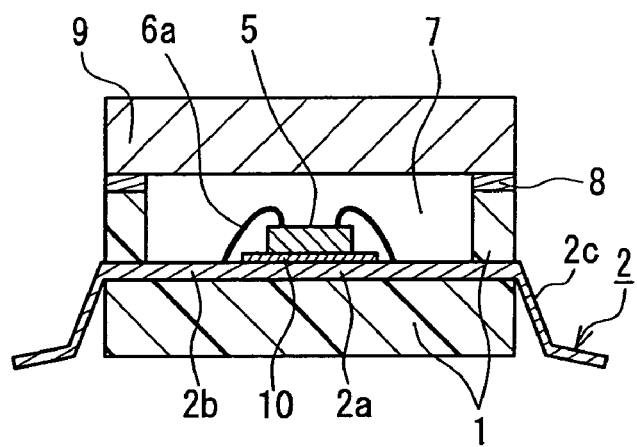
FIG. 7B is a sectional view showing this semiconductor device.
Figure 8A:
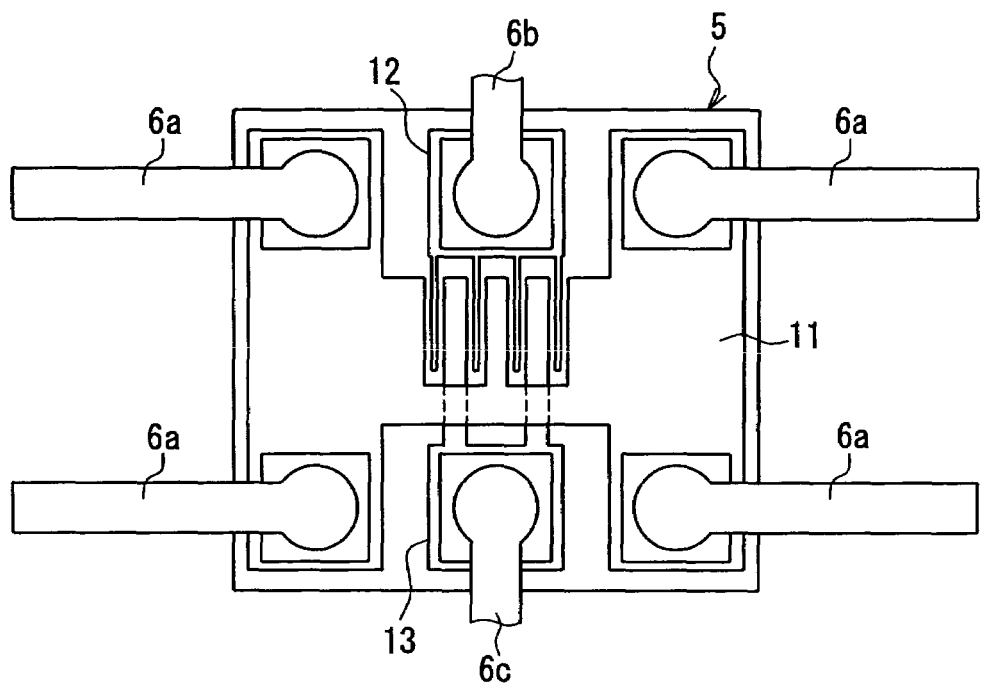
FIG. 8A is a plan view showing a structure of where a semiconductor chip and a source lead are connected in the semiconductor device.
Figure 8B:
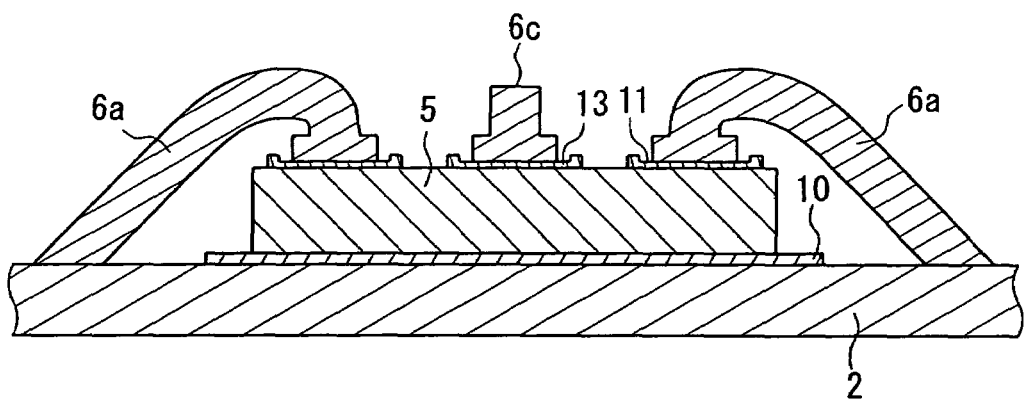
FIG. 8B is a sectional view thereof.
Figure 9A:
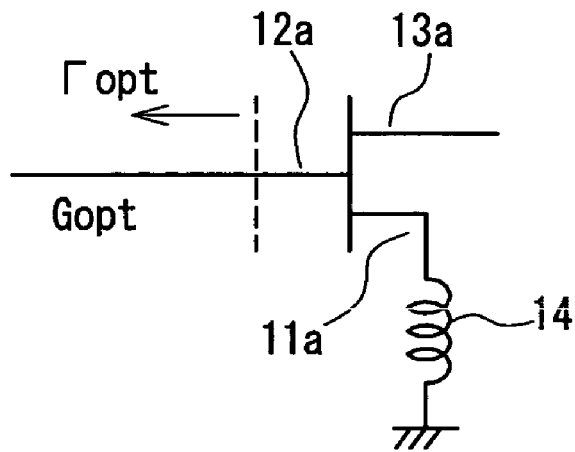
FIG. 9A is a circuit diagram of the semiconductor device.
Figure 9B:
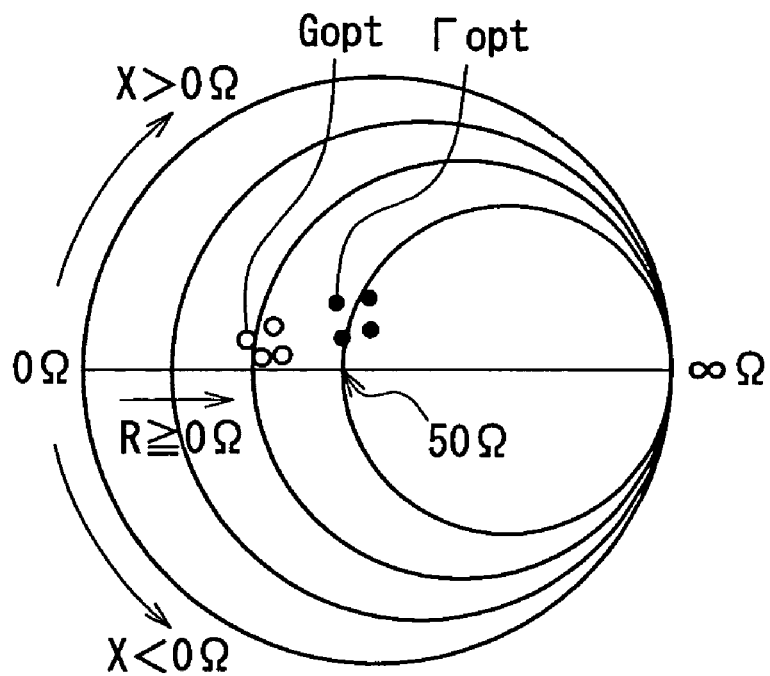
FIG. 9B is a Smith chart thereof

A semiconductor device in a third embodiment will be described referring to FIGS. 6A to 6C. FIG. 6A is a plan view showing the semiconductor device whose resin packing has been removed partially, FIG. 6B is a sectional view taken along a line B–B' of FIG. 6A, and FIG. 6C is a circuit diagram of this semiconductor device. In the present embodiment, conductor leads having an inductance element portion are connected to a gate and a drain of an HEMT chip.

As shown in FIGS. 6A and 6B, an HEMT chip 31 is mounted on a die pad 30. A source lead 32, a drain lead 33 and a gate lead 34 are arranged around the HEMT chip 31 and connected respectively to a source, a drain and a gate (not shown) of the HEMT chip 31 by bonding wires 35.

In the drain lead 33, a first inductor 36 and a second inductor 37 are formed. An output lead terminal 38 is branched off from between the first inductor 36 and the second inductor 37. In the gate lead 34, a third inductor 39 and a fourth inductor 40 are formed. An input lead terminal 41 is branched off from between the third inductor 39 and the fourth inductor 40. The first inductor 36, the second inductor 37, the third inductor 39 and the fourth inductor 40 are formed to be meandering.

The above-described elements are sealed with a sealing resin 42, so that ends of the source lead 32, the drain lead 33 and the gate lead 34 are exposed beyond the sealing resin 42 and form a source terminal 32a, a drain terminal 33a and a gate terminal 34a as external terminal portions. Ends of the output lead terminal 38 and the input lead terminal 41 also are exposed beyond the sealing resin 42.

The first inductor 36 and the third inductor 39 function as a choke inductor or a matching element. The second inductor 37 and the fourth inductor 40 function as a matching element.

In the present embodiment, a capacitive element, an inductive element or a resistance element (such as a chip component) may be connected with the leads. For example, a chip capacitive component is disposed and connected between the first inductor 36 and the lead connected to a ground terminal of the device such as the source lead 32. Alternatively, such a chip capacitive component may be disposed and connected between any of the third inductor 39, the second inductor 37 and the fourth inductor 40 or other lead portions. The above-described disposition and connection of the chip capacitive component also can be applied to the cases of the first and second embodiments.

In the embodiments described above, even when a field-effect transistor or a bipolar transistor other than the HEMT chip is mounted as a semiconductor chip, it is possible to achieve an effect similar to the above by applying the structure of each embodiment.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor device comprising:
a semiconductor chip;
a mold resin sealing the semiconductor chip; and
a plurality of conductor leads extending from an inside of the mold resin to an outside thereof, each having a portion arranged inside the mold resin defining an internal terminal portion and a portion arranged outside the mold resin defining an external terminal portion, and an electrode of the semiconductor chip and the internal terminal portion of the conductor lead being connected;
wherein at least one of the conductor leads has two inductance element portions,
an additional external terminal portion is branched off from between the two inductance element portions,
the inductance element portions have a meandering planar shape, and
the conductor lead with the inductance element portions has an overlapping portion overlapping a lower surface of the semiconductor chip at which the semiconductor ship is mounted on and connected with the conductor lead.

2. The semiconductor device according to claim 1, wherein in the overlapping portion of the electrode of the semiconductor chip and the conductor lead, the connection is made via an electrical conductor in a via hale formed in the semiconductor chip.

3. The semiconductor device according to claim 1, wherein the overlapping portion of the conductor lead forms a die pad portion on which the semiconductor chip is mounted.

4. The semiconductor device according to claim 1, wherein the conductor lead having the inductance element portion is connected to a source of a field-effect transistor or an emitter of a bipolar transistor formed lute semiconductor chip.

5. The semiconductor device according to claim 1, wherein the conductor lead having the inductance element portion is connected to a gate or a drain of a field-effect transistor or a base or a collector of a bipolar transistor formed in the semiconductor chip.

6. The semiconductor device according to claim 1, wherein at least one of the conductor leads functions as a choke inductor or matching element.

7. A semiconductor device comprising:
a semiconductor chip;
a mold resin sealing the semiconductor chip; and
a plurality of conductor leads extending from an inside of the mold resin to an outside thereof, each having a portion arranged inside the mold resin defining an internal terminal portion and a portion arranged outside the mold resin defining an external terminal portion, and an electrode of the semiconductor chip and the internal terminal portion of the conductor lead being connected;
wherein at least two of the conductor leads have two inductance element portions, and
an additional external terminal portion is branched off from between the two inductance element portions;
the two internal terminal portions are arranged symmetrically with respect to the semiconductor chip, with the semiconductor chip being interposed therebetween, and
a width of the inductance element portion connected to the external terminal portion is larger than a width of the inductance element portion connected to the internal terminal portion.

* * * * *